United States Patent [19]  [11] 4,417,387
Heslop  [45] Nov. 29, 1983

[54] GOLD METALLIZATION IN SEMICONDUCTOR DEVICES

[75] Inventor: Christopher J. Heslop, Woodbridge, England

[73] Assignee: The Post Office, London, England

[21] Appl. No.: 254,513

[22] Filed: Apr. 15, 1981

[30] Foreign Application Priority Data

Apr. 17, 1980 [GB] United Kingdom ............... 80 12688

[51] Int. Cl.³ ............................................. H01C 17/28
[52] U.S. Cl. ....................................... 29/591; 29/578; 427/89; 357/71
[58] Field of Search .......................... 29/571, 578, 591; 357/71; 427/84, 89; 428/620, 660, 672

[56] References Cited

U.S. PATENT DOCUMENTS

| | | | |
|---|---|---|---|
| 3,345,210 | 10/1967 | Wilson | 357/71 X |
| 3,601,666 | 8/1971 | Leedy et al. | 357/71 |
| 3,647,585 | 3/1972 | Fritzinger et al. | 357/71 X |
| 3,686,080 | 8/1972 | Banfield et al. | 427/89 X |
| 3,900,944 | 8/1975 | Fuller et al. | 427/89 X |
| 4,005,455 | 1/1977 | Watrous et al. | 357/71 |

Primary Examiner—Brian E. Hearn
Assistant Examiner—David A. Hey
Attorney, Agent, or Firm—Cushman, Darby & Cushman

[57] ABSTRACT

Gold is preferred as the conductor material in a metallization layer of a semiconductor device because of its high conductivity and freedom from electromigration effects but gold is inclined to diffuse into the semiconductor substrate typically silicon, so degrading the p-n junction characteristics within the semiconductor substrate and rendering the device inoperative. Previously this problem has been overcome by placing a protective barrier layer of titanium between the gold layer and the substrate. The gold/titanium interface is subject to corrosion and this corrosion adjacent the substrate containing the active areas of the device also leads to failure of the device. This is prevented by covering the gold metallization layer of the device on its top, bottom and side surfaces with titanium. This prevents the diffusion of the gold into any other layer of the semiconductor device above or below it and there is no gold/titanium interface exposed adjacent any active area of the device.

9 Claims, 5 Drawing Figures

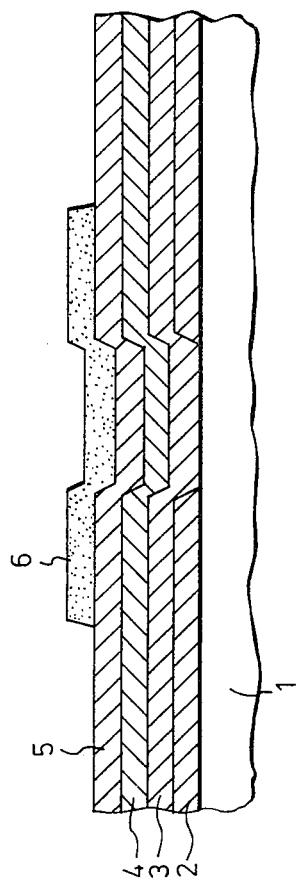
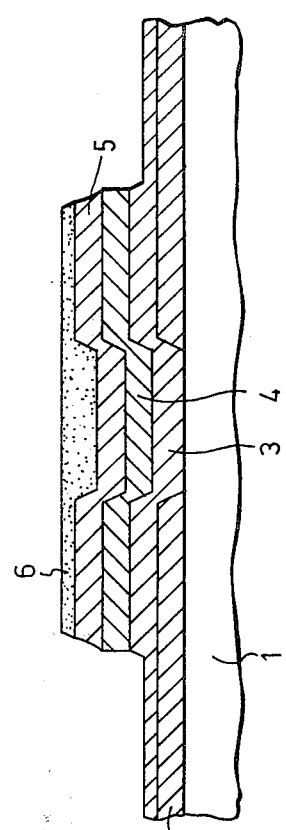
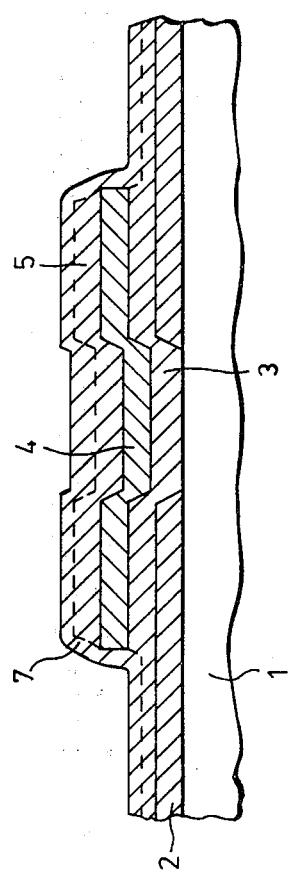

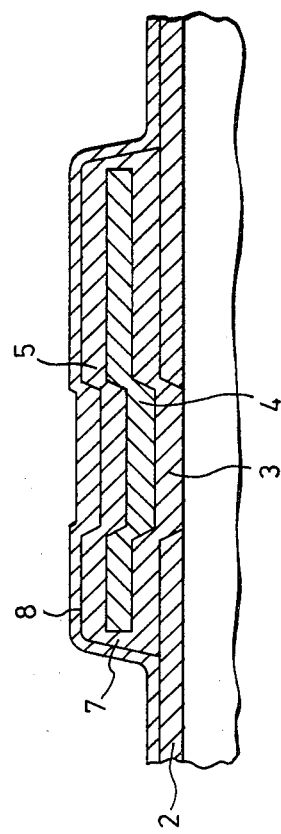
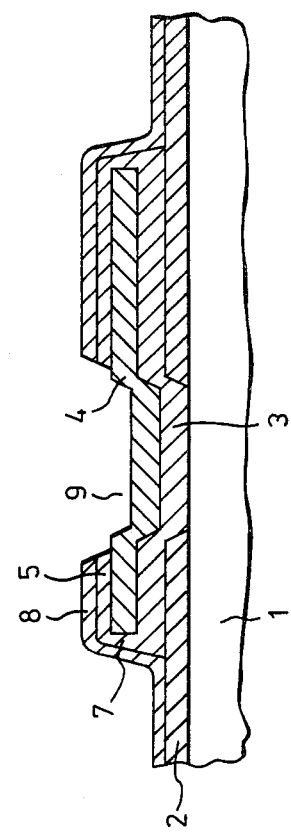

GOLD METALLIZATION IN SEMICONDUCTOR DEVICES

This invention is concerned with gold metallisation layers in semiconductor devices. Gold is preferred as the conductor material in a metallisation layer of a semiconductor device because of its high conductivity and freedom from electromigration effects. This is particularly true when the device is an integrated circuit device arranged to operate at high frequencies. However, there is a problem in using gold as the conductor since gold diffuses into the semiconductor substrate, typically silicon, so degrading the p-n junction characteristics within the semiconductor substrate and rendering the device inoperative.

One way of overcoming this problem is to put a layer of titanium on the substrate and then follow this with a gold metallisation layer which is narrower than the titanium layer so that the titanium layer covers the entire undersurface of the gold layer and overlaps the periphery of the gold layer. This layer of titanium thus forms a barrier and prevents the gold diffusing into the substrate during operation at normal temperatures. This arrangement has been successful for hermetically encapsulated devices but the titanium/gold interface is susceptible to corrosion in non-hermetically encapsulated devices.

It is also known, for example from U.S. Pat. No. 3,686,080, to use a multi-layer element as a barrier between gold metallisation and a substrate. In this U.S. specification a multi-layer barrier formed by a layer of titanium adjacent the substrate is covered by a layer of a platinum group metal such as platinum, palladium, ruthenium, oxmium, rhodium, or iridium, then this is, in turn, covered by a gold metallisation layer. The multi-layer barrier region in this disclosure does not overlap the area covered by the gold metallisation layer and consequently this barrier region would form a less effective barrier against the diffusion of gold into the substrate.

U.S. Pat. No. 3,900,944 discloses the use of a titanium tungsten alloy or a layer of tantalum as a barrier region separating a gold metallisation layer and a substrate. Again in this specification the barrier layer of titanium tungsten alloy or tantalum does not overlap the gold metallisation layer and consequently this barrier region forms a less effective barrier against the diffusion of gold into the substrate. In the device shown in this specification the top surface of the gold metallisation layer is also covered with tantalum and this specification describes the upper layer of tantalum as improving the bond between the gold layer and any subsequently applied layer of electrical insulation such as silicon dioxide. It is known that nonreactive metals such as gold, silver and copper do cause problems in multi-layer metallurgy in which a number of metal layers are provided insulated from one another by layers of silicon or silicon dioxide. In multi-layer metallurgy it is customary to use intermediate layers of more reactive metals such as chromium or titanium which have a better adhesion to the silicon or silicon dioxide, both above and below the layers of non-reactive metal.

It is also known to use layers of titanium to improve the adhesion of an insulating layer to a layer of silver metallisation. IBM Technical Disclosure Bulletin Volume 13 No. 5 at page 1118 describes the manufacture of a semiconductor device with multi-layer silver metallurgy and describes how a layer of titanium is provided beneath a silver metallisation layer to improve the adhesion of the silver to the substrate and how the top surface of the layer of silver is covered with a layer of chromium. As a result of the selective etching to obtain the required pattern of silver metallisation the side walls of the layer of silver are exposed and this disclosure goes on to discuss how these side walls are coated with a coating of chromium or titanium to improve the adhesion of a subsequently applied insulating layer of silicon or silicon dioxide to them. Thus, with the construction described in this disclosure the silver metallisation is covered on three sides or one side with titanium and on one side or three sides with chromium, respectively. The coated silver metallisation layer is subsequently covered with a layer of silicon dioxide and this layer of silicon dioxide is described as adhering firmly to the coating metal.

Where a gold metallisation layer is separated from a substrate by a barrier layer of titanium, the titanium/gold interface is exposed at the sides of the gold metallisation layer and the titanium/gold interface is susceptible to corrosion in non-hermetically encapsulated devices. The region between the titanium/gold interface adjacent the substrate is adjacent an active area of the semiconductor device and any corrosion in this region affects the active area and so leads to breakdown of the device. This invention aims to overcome the problems involved with the diffusion of the gold from a gold metallisation layer into a substrate and, at the same time, overcome the additional problems that the previously proposed solutions have involved, such as corrosion between a titanium/gold interface adjacent an active area of the device.

According to a first aspect of this invention, a semiconductor device including a semiconductor substrate a gold metallisation layer and a titanium barrier layer interposed between the gold metallisation layer and the substrate, is characterised in that the gold metallisation layer also has titanium applied to its top and side edges.

Naturally, a portion of the gold metallisation layer is exposed to provide a bonding pad to which a contact is bonded but such a contact pad is on the opposite face of the gold metallisation layer from the substrate and therefore away from the active areas of the device. Since the gold metallisation layer is covered by titanium on its top, bottom and side surfaces, diffusion of the gold from the metallisation layer in to the silicon substrate is prevented and, in addition, there are no titanium/gold interfaces adjacent the active area of the device which are exposed and consequently failure of the device by corrosion at the interface is prevented. A further advantage is that any passivation coating or other layer applied on top of the gold metallisation layer is applied to a titanium surface instead of a gold surface and thus bonds tightly onto it.

According to a second aspect of this invention a method of preparing a semiconductor device including the steps of depositing a layer of titanium over at least part of the surface of a substrate, and covering at least part of the titanium layer with a metallisation layer of gold, is characterised in that all of the gold metallisation layer including its side edges is covered with a second layer of titanium to encase the gold metallisation layer in titanium.

The semiconductor device may be prepared by selectively depositing, or depositing and then selectively removing, the first layer of titanium over predetermined areas of the substrate and then this followed by the deposition of the gold metallisation layer over a predetermined area of the first titanium layer to leave an exposed rim of titanium surrounding the gold metallisation layer. Once again, the gold metallisation layer may be deposited selectively or deposited and then selectively removed to achieve this. This is then followed by the deposition of the second titanium layer over substantially the same areas as the first titanium layer so that it covers the top and side surfaces of the gold metallisation layer to encase the gold metallisation layer in titanium. Again, the second titanium layer may be deposited and selectively removed to achieve this effect.

It is, however, preferred to make semiconductor devices by applying a continuous layer of titanium, covering this with the gold metallisation layer and the second layer of titanium, then selectively removing portions of the second layer of titanium and the gold metallisation layer to provide the required pattern of the gold metallisation layer, and then depositing a continuous third layer of titanium over the entire surface to cover both the second and first layers of titanium and the side edges of the gold metallisation layer. In this case it is preferred that the device is then subjected to an etching step which removes the titanium from top surfaces of the gold metallisation layer and the substrate in preference to that present on the side edges of the gold metallisation layer to leave the gold metallisation layer encased in a uniform thickness of titanium.

Preferably the selective removal of the second layer of titanium and the gold metallisation layer also removes at least a part of the thickness of the first titanium layer. The selective removal may be carried out by an initial etching treatment selectively to remove the second layer of titanium followed by an ion milling step in which the surface of the device is bombarded by a stream of ions to remove the titanium layer and the gold layer from the surface of the substrate by sputtering, the remains of the second layer of titanium acting as a mask. The ion milling step provides the gold metallisation layer with a steep edge. The initial etching treatment selectively to remove the second layer of titanium may be carried out by a conventional wet chemical etching or by a plasma etching of exposed parts of the second layer of titanium exposed after a layer of photoresist applied to the surface to the device has been selectively removed.

After the third layer of titanium is applied to the device, there is a thicker layer of titanium on the top surface to the layer of gold metallisation and on the top surface of the substrate than on the side edges of the gold metallisation layer. When the device is subjected to plasma etching using, for example, carbon tetrachloride as the etchant, this preferentially removes titanium from the top surfaces above the gold metallisation and above the substrate and removes hardly any of the titanium from the side edges of the gold metallisation. The plasma etching step is preferably continued until all of the exposed titanium present on the surface of the substrate is removed. At the completion of the plasma etching step, the thickness of the titanium coating on the top and bottom surfaces of the gold metallisation layer is preferably substantially the same as the thickness of that on the side edges of the gold metallisation.

The method may also include the step of depositing a passivation coating on top of the titanium encased gold metallisation layer and on top of the surface of the substrate. The passivation layer is preferably formed by a layer of silicon nitride and preferably this is deposited at a temperature not greater than 320° C. It is desirable to carry out the deposition of the passivation layer at as low a temperature as possible when the device includes a gold metallisation layer and silicon nitride is one of the few materials which can be used to form a passivation layer and which can be deposited at temperatures as low as 300° C.

A window may be opened up through any passivating coating and the second layer of titanium to expose the gold metallisation layer to form a bonding pad and again this is preferably achieved using a photoresist followed by a plasma etching step to remove the passivation coating and the second titanium layer. Opening a window to provide a bonding pad on the gold metallisation layer does expose an interface between gold and titanium but this interface is on the side of the gold metallisation layer remote from the substrate and thus on the side of the gold metallisation layer remote from the active area of the device and thus any corrosion or breakdown of this portion of the interface is unlikely to lead to a corresponding breakdown in the device in operation.

BRIEF DESCRIPTION OF THE DRAWINGS

A particular example of a semiconductor device and a method of making it in accordance with this invention will now be described with reference to FIGS. 1 to 5 of the accompanying drawings which are all diagrammatic cross-sections through the device at various stages of its construction with the vertical dimension greatly exaggerated.

A silicon substrate 1 which normally includes a number of circuit elements (not shown) has a surface layer of silicon dioxide 2 formed over particular regions of its surface. Various gaps are provided in the silicon dioxide film through which conductors from the wiring layer make contact with the various circuit elements.

To form the wiring layer of conductors on the device the entire surface of the device is coated firstly with a continuous first layer of titanium 3 then with a layer of gold 4 and then with a second layer of titanium 5. The upper surface of the layer 5 is coated with a layer of photoresist 6 and this is exposed, developed and removed to provide a pattern of photoresist 6 corresponding to the required pattern for the wiring or the metallisation layer of the device. The substrate is then subjected to a wet chemical etching treatment using a mixture of acetic, nitric and hydrofluoric acids, as the etchant to etch the second layer of titanium 5 into the required pattern. This wet etching technique may be continued to etch the layer of gold 4 as well, but it is preferred that the wet etching step is stopped once the selected parts of the second layer of titanium 5 have been removed. As a result of the wet etching, the sides of the layer 5 slope as shown in FIG. 2. The substrate is then subjected to an ion milling step in which it is bombarded by ions with the layer 6 of the photoresist together with the remaining portion of the second layer of titanium 5 forming a mask. The ion milling step is continued until the gold layer 4 has been selectively removed from all regions save from that beneath the layer of photoresist 6 and the layer of titanium 5, and until the first layer of titanium over the surface of the substrate 1 is reduced by about 2000 Å. The remainder of the layer of photoresist 6 is then removed by ashing which is a treatment in which the surface is exposed to an oxygen plasma which reacts with the carbon based photoresist to oxidise and remove it.

A further layer of titanium 7 having a thickness of about 5000 Å is then deposited on the substrate. This layer 7 covers the remainder of the first layer 3, the side edges of the gold layer 4 and the second layer of titanium 5. The surface covered by the third layer of titanium 7 is then plasma etched using a plasma containing carbon tetrachloride gas and plasma etching has the property of a high ratio of vertical to horizontal etching and which normally gives very steep edges to etched patterns. In the present case, this means that the titanium is preferentially removed from the horizontal surfaces and thus all the layer 7 is removed from above the layer 5 with some of the layer 5 also being removed and all of the layer 7 and the layer 3 are removed from above the substrate to expose the surface of the silicon dioxide layer 2.

However, substantially none of the layer 7 is removed from the side edges of the gold layer 4. This results in the layer 4 being completely encased in a substantially uniform coating of titanium on all sides.

A passivation layer of silicon nitride 8 is then deposited over the entire surface of the device using conventional techniques of deposition from the vapour phase. The nitride layer 8 adjeres firmly to both the silicon dioxide layer 2 and to the titanium in the layers 3, 5 and 7. A window 9 is then cut through the passivation layer 8 and the second layer 5 of titanium to expose a portion of the gold layer 4 to form a bonding pad using conventional photoresist techniques followed by a plasma etching step. This exposure of the gold layer 4 to form a bonding pad, whilst exposing the interface between the layer 5 of titanium and the gold, does not impair the efficiency of the device since this interface is remote from the substrate 1 containing the active regions of the device.

I claim:

1. In a method of preparing a semiconductor device including the steps of providing a semiconductor substrate, depositing a layer of titanium over at least part of said substrate, and covering at least part of said titanium layer with a metallisation layer of gold, the improvement wherein all of said gold metallisation layer including its side edges is covered with a second layer of titanium to encase said gold metallisation layer in said titanium.

2. The method of claim 1, wherein a continuous layer of titanium is applied, said continuous layer of titanium is covered by said gold metallisation layer and said gold metallisation layer is covered by said second layer of titanium, wherein portions of said second layer of titanium and said gold metallisation layer are selectively removed to provide a required pattern of said gold metallisation layer, and wherein a third continuous layer of titanium is deposited to cover both said second and said first layers of titanium and said side edges of said gold metallisation layer.

3. The method of claim 2, wherein said device is subsequently subjected to an etching step preferentially to remove said titanium from top surfaces of said gold metallisation layer and said substrate in preference to said titanium present on said side edges of said gold metallisation layer to leave said gold metallisation layer encased in a substantially uniform thickness of said titanium.

4. A method according to claim 2, wherein said selective removal of said second layer of titanium and said gold metallisation layer also removes at least a part of the thickness of said first titanium layer.

5. The method of claim 4, wherein said selective removal is carried out by an initial etching treatment selectively to remove said second layer of titanium followed by an ion milling step wherein the exposed surface of the device is bombarded by a stream of ions to remove said at least part of the thickness of said first titanium layer and said gold metallisation layer by sputtering, remaining parts of said second layer of titanium acting as a mask.

6. The method of claim 1, 4 or 5, wherein a passivation coating is applied over said other layers.

7. The method of claim 6, wherein said passivation layer is formed by a layer of silicon nitride and wherein said layer of silicon nitride is deposited at a temperature not greater than 320° C.

8. The method of claim 6, wherein a window is opened up through said passivating coating and through said second layer of titanium to expose said gold metallisation layer to form a terminal bonding pad.

9. The method of claim 1, wherein a window is opened up through said second layer of titanium to expose said gold metallisation layer to form a terminal bonding pad.

* * * * *